United States Patent
Lin et al.

(10) Patent No.: US 10,109,490 B1
(45) Date of Patent: Oct. 23, 2018

(54) COBALT INTERCONNECTS FORMED BY SELECTIVE BOTTOM-UP FILL

(71) Applicant: GLOBALFOUNDRIES Inc., Grand Cayman (KY)

(72) Inventors: Sean X. Lin, Watervliet, NY (US); Xunyuan Zhang, Troy, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/627,879

(22) Filed: Jun. 20, 2017

(51) Int. Cl.
*H01L 21/768* (2006.01)
*H01L 21/28* (2006.01)
*H01L 29/66* (2006.01)
*C23C 16/06* (2006.01)
*C22B 23/00* (2006.01)
*C01G 51/00* (2006.01)

(52) U.S. Cl.
CPC ........ *H01L 21/28061* (2013.01); *C23C 16/06* (2013.01); *H01L 21/76802* (2013.01); *H01L 29/665* (2013.01); *C01G 51/00* (2013.01); *C22B 23/00* (2013.01)

(58) Field of Classification Search
CPC . H01L 21/28; H01L 21/28061; H01L 21/768; H01L 21/76802; H01L 21/823475; H01L 21/823871; C23C 16/06; C22B 23/00; C01G 51/00

USPC .......................................................... 438/592
See application file for complete search history.

(56) References Cited

U.S. PATENT DOCUMENTS

| 6,727,579 | B1 | 4/2004 | Eldridge et al. |
| 8,673,766 | B2 | 3/2014 | Lin et al. |
| 2008/0029879 | A1 | 2/2008 | Tuckerman et al. |
| 2013/0309863 | A1* | 11/2013 | Lin .................. H01L 21/76843 438/653 |
| 2015/0179579 | A1* | 6/2015 | Jezewski ........... H01L 21/76846 257/753 |
| 2017/0170062 | A1* | 6/2017 | Murray ............ H01L 21/76879 |

FOREIGN PATENT DOCUMENTS

WO 96/17378 A1 6/1996

* cited by examiner

*Primary Examiner* — Chuong A Luu
(74) *Attorney, Agent, or Firm* — Thompson Hine LLP; Anthony Canale

(57) ABSTRACT

Methods for forming interconnects that include cobalt. An interconnect opening is formed in a dielectric layer that penetrates from a top surface of the dielectric layer into the dielectric layer. A first cobalt layer is formed at a bottom of the interconnect opening and partially fills the interconnect opening. A second cobalt layer is selectively deposited on the first cobalt layer and grows upwardly from the first cobalt layer at the bottom of the interconnect opening.

18 Claims, 3 Drawing Sheets

COBALT INTERCONNECTS FORMED BY SELECTIVE BOTTOM-UP FILL

BACKGROUND

The present invention relates to integrated circuits and semiconductor device fabrication and, more specifically, to methods for forming interconnects that include cobalt.

An interconnect structure may be used to electrically connect device structures fabricated on a substrate by front-end-of-line (FEOL) processing. A back-end-of-line (BEOL) portion of the interconnect structure may include metallization formed using a damascene process in which via openings and trenches etching in a dielectric layer are filled with metal to create features of a metallization level. The lowest metal level of the BEOL interconnect structure may be coupled with the device structures by features, such as contacts, that are formed by middle-of-line (MOL) processing prior to BEOL processing.

Cobalt is a candidate material to replace tungsten in the metallization of the MOL portion of the interconnect structure and to replace copper in the metallization of the BEOL portion of the interconnect structure. With scaling to smaller feature sizes (e.g., 7 nm and smaller nodes), BEOL and MOL features characterized by high aspect ratios of depth to width may be difficult to fill without pinch-off and the formation of voids.

Improved methods are needed for forming interconnects that include cobalt.

SUMMARY

According to an embodiment of the invention, a method includes forming an interconnect opening in a dielectric layer that penetrates from a top surface of the dielectric layer into the dielectric layer, forming a first cobalt layer at a bottom of the interconnect opening that partially fills the interconnect opening, and selectively forming a second cobalt layer on the first cobalt layer that grows upwardly from the first cobalt layer at the bottom of the interconnect opening.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
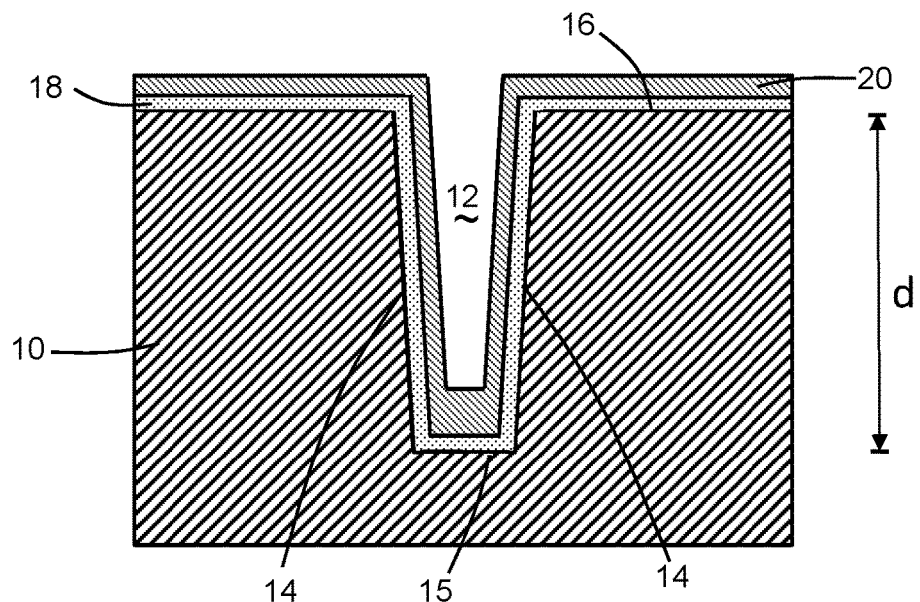
FIGS. 1-5 are cross-sectional views of a structure at successive fabrication stages of a processing method in accordance with embodiments of the invention.

With reference to FIG. 1 and in accordance with an embodiment of the invention, a dielectric layer 10 may be processed by middle-of-line (MOL) processing or back-end-of-line (BEOL) to form a metallization level of an interconnect structure. The dielectric layer 10 may be composed of an electrical insulator, such as silicon dioxide ($SiO_2$) or another suitable dielectric material, such as a low-κ dielectric material or an ultra-low-κ (ULK) dielectric material having a dielectric constant that is less than the dielectric constant of silicon dioxide.

Interconnect openings, of which interconnect opening 12 is representative, may be formed by photolithography and etching at selected locations distributed across the surface area of dielectric layer 10. Specifically, a photoresist layer may be applied, exposed to a pattern of radiation projected through a photomask, and developed to form a corresponding pattern of openings situated at the intended locations for the interconnect openings The patterned photoresist layer is used as an etch mask for a dry etching process, such as a reactive-ion etching (ME), that removes portions of the dielectric layer 10 to form the interconnect openings. The etching process may be conducted in a single etching step or multiple etching steps with different etch chemistries.

The interconnect opening 12 may be a contact opening or a trench defined in the dielectric layer 10, and may have an aspect ratio of height-to-width that is characteristic of a contact opening or a trench. The interconnect opening 12 has one or more sidewalls 14 that penetrate from a top surface 16 of the dielectric layer 10 to a surface at the bottom 15 of the interconnect opening 12. The sidewalls 14 are bounded by the dielectric material of the dielectric layer 10, and the bottom 15 may also be bounded by the dielectric material of the dielectric layer 10. The interconnect opening 12 may penetrate to a given depth, d, into the dielectric layer 10 that is less than the thickness of dielectric layer 10 or completely through the thickness of dielectric layer 10. The interconnect opening 12 may land at its bottom 15 on an underlying feature (not shown) as part of a process to establish a vertical interconnect feature.

A barrier/liner layer 18 of a given thickness is deposited on the sidewalls 14 and at the bottom 15 of the interconnect opening 12, and also forms in the field area on the top surface of the dielectric layer 10. The barrier/liner layer 18 may be comprised of titanium (Ti), titanium nitride (TiN), tantalum (Ta), tantalum nitride (TaN), ruthenium (Ru), or a multilayer combination of these materials (e.g., a Ti/TiN bilayer) deposited by physical vapor deposition (PVD) with, for example, a sputter-assisted process, chemical vapor deposition (CVD) or atomic layer deposition (ALD). The barrier/liner layer 18 conforms to the shape of the interconnect opening 12 such that the dielectric layer 10 bordering the sidewalls 14 of the interconnect opening 12 is completely covered with a uniform given thickness.

A cobalt layer 20 of a given conformal thickness may be formed on the barrier/liner layer 18 at the sidewalls 14 and on the field area on the top surface of the dielectric layer 10, as well as with a given conformal thickness on the barrier/liner layer 18 at the bottom 15 of the interconnect opening 12. The cobalt layer 20 may be deposited by a conformal deposition process, such as chemical vapor deposition (CVD) using a cobalt-containing precursor (e.g., a cobalt-containing carbonyl precursor) as a reactant.

Figure 2:
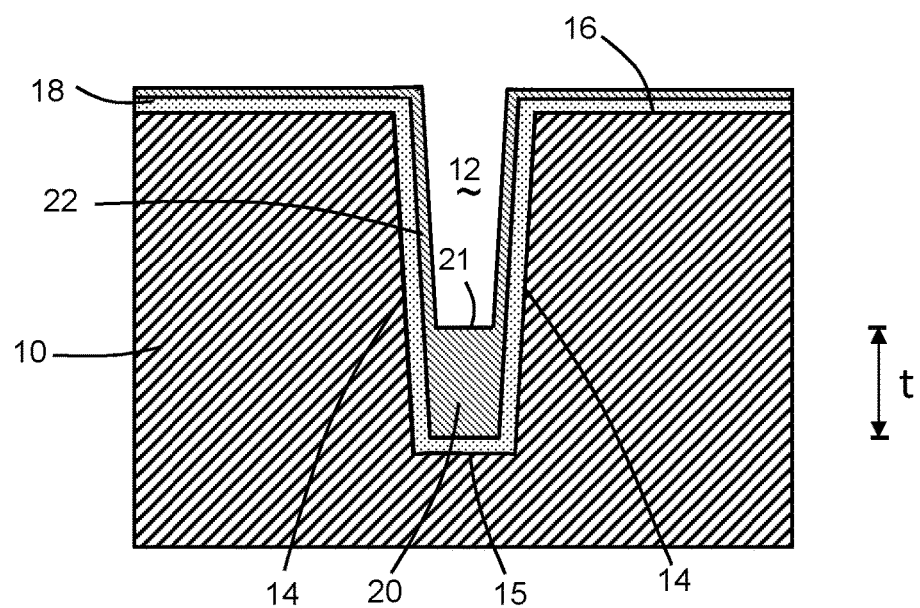

With reference to FIG. 2 in which like reference numerals refer to like features in FIG. 1 and at a subsequent fabrication stage, a thermal process may applied to cause cobalt in the portion of cobalt layer 20 deposited on the sidewalls 14 of the interconnect opening 12 and/or the field area of the dielectric layer 10 to reflow toward the bottom of the interconnect opening 12. The cobalt transported to the bottom 15 of the interconnect opening 12 increases the thickness, t, of the cobalt layer 20 inside the interconnect opening 12. The thermal process may comprise annealing or heating the cobalt layer 20 at an elevated temperature, such as a temperature in a range of 100° C. to 400° C. The thermal process may be conducted in a reducing atmosphere, such as an atmosphere containing hydrogen. In the representative embodiment, the thermal process is conducted following deposition of the cobalt layer 20. In an alternative embodiment, the thermal process may be conducted during deposition of the cobalt layer 20. In another alternative embodiment, the thermal process may be conducted during deposition of the cobalt layer 20 and following the deposition of the cobalt layer 20 in which instance the respective elevated temperatures may be identical or may be different.

The thermal process accelerates cobalt surface diffusion, particularly from the sidewalls 14 of the interconnect opening 12 toward the bottom 15 of the interconnect opening 12, and increases the fill depth (i.e., the thickness) upward from the bottom 15 of the interconnect opening 12. Despite the thermally-induced transport of cobalt to the bottom of the interconnect opening 12, a residual thickness of the cobalt layer 20 remains on the sidewalls 14 of the interconnect opening 12 following the thermal process. Due to the nature of the reflow process, the thickness of the cobalt layer 20 at the bottom 15 of the interconnect opening 12 following the thermal process is greater than the residual thickness of the cobalt layer 20 on the sidewalls 14 of the interconnect opening 12.

The cobalt deposition and reflow process may be repeated to iteratively increase the thickness of the cobalt layer 20 inside the interconnect opening 12 upward from the bottom 15 and achieve a targeted thickness, t. Specifically, one or more additional iterations of depositing a cobalt layer 20 and reflowing the cobalt constituting the cobalt layer 20 to the bottom 15 of the interconnect opening 12. As a result of the repetition of the cobalt deposition and reflow process, the thickness of cobalt incrementally rises inside the interconnect opening 12 upward from the bottom 15 toward the top surface 16 of the dielectric layer 10. Following the final deposition/reflow sequence, the top surface 21 of the cobalt layer 20 is recessed relative to the top surface 16 of the dielectric layer 10 and an open space inside the interconnect opening 12 above the cobalt layer 20 is unfilled. The thickness of the cobalt layer 20 is less than the depth of the interconnect opening 12. A residual layer 22 of cobalt is located on the barrier/liner layer 18 covering the sidewalls 14 of the interconnect opening 12, as well as on the barrier/liner layer 18 on the top surface 16 of the dielectric layer 10.

Figure 3:
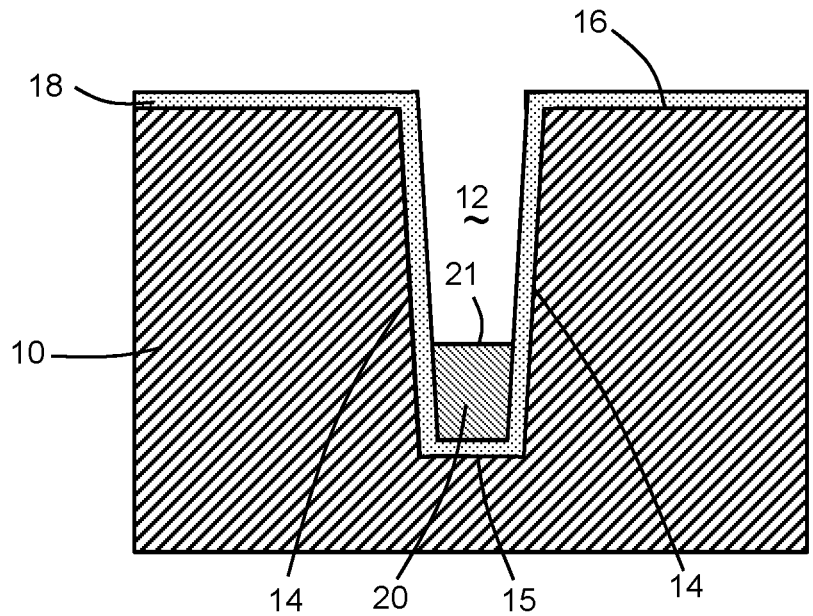

With reference to FIG. 3 in which like reference numerals refer to like features in FIG. 2 and at a subsequent fabrication stage, the residual layer 22 is removed from the sidewalls 14 of the interconnect opening 12, which exposes the barrier/liner layer 18. The residual layer 22 may also be removed from the top surface 16 of the dielectric layer 10. A wet chemical etching process with an appropriate etch chemistry may be used to remove the residual layer 22 selective to the material(s) of the barrier/liner layer 18. For example, a suitable etch chemistry may include a diluted acid solution, such as diluted sulfuric acid ($H_2SO_4$), diluted hydrochloric acid (HCl), or diluted hydrofluoric acid (HF). As another example, a suitable etch chemistry may include a mixture of peroxide with an acid or a base, such as a mixture of water ($H_2O$), hydrogen peroxide ($H_2O_2$), and HCl (i.e., a SC2 clean), or a mixture of $H_2O$, $H_2O_2$, and ammonium hydroxide ($NH_4OH$) (i.e., a SC1 clean). Due to the thickness differential, the cobalt layer 20 at the bottom 15 of the interconnect opening 12 is only thinned to a negligible extent by the wet chemical etching process removing the residual layer 22.

Figure 4:
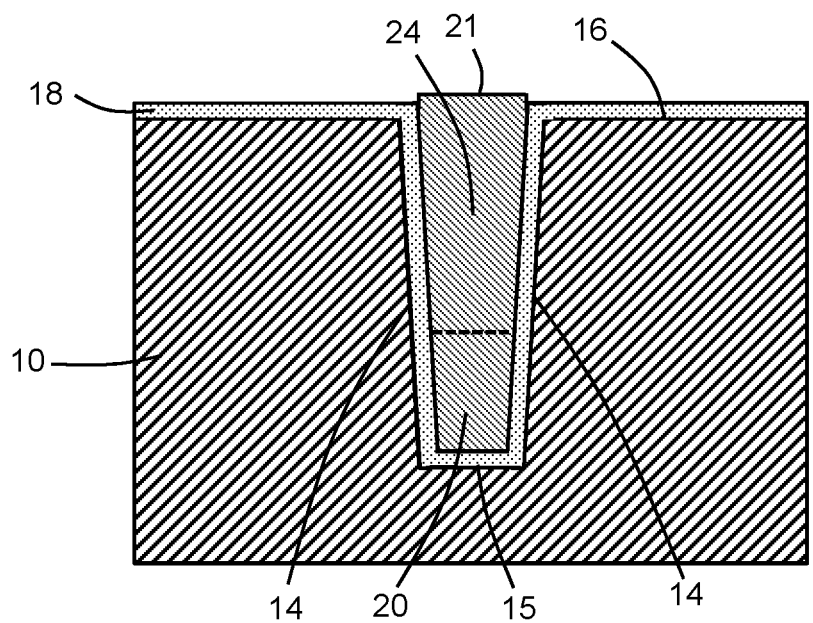

With reference to FIG. 4 in which like reference numerals refer to like features in FIG. 3 and at a subsequent fabrication stage, a cobalt layer 24 is deposited using a deposition process, such as electroless deposition, that differs from the deposition process used to deposit the cobalt layer 20 that is reflowed into the interconnect opening 12. In particular, the deposition process forming the cobalt layer 24 is selective in that cobalt only deposits initially from the top surface 21 (FIG. 3) of the prior-formed cobalt layer 20 and grows upwardly from the top surface 21 within the interconnect opening 12. The cobalt layer 24 does not grow from the barrier/liner layer 18 covering the sidewalls 14 of the interconnect opening 12. The deposition process is non-conformal in contrast to the deposition process forming the cobalt layer 20, and the deposition processes may be performed sequential. The bottom-up filling of the interconnect opening 12 from the cobalt layer 20 at the bottom 15 of the interconnect opening 12 upward toward the top surface 16 of the dielectric layer 12 is continued by the deposition of the cobalt layer 24. In an embodiment, the interconnect opening 12 may be slightly overfilled such that a top surface 25 of the cobalt layer 24 projects above the top surface 16 of the dielectric layer 10 at the entrance to the interconnect opening 12.

The bottom-up growth process from the selective growth or deposition of cobalt layer 24 permits the interconnect opening 12 to be filled with cobalt without pinch-off and voids. Due to the removal of the residual layer 22 from the sidewalls 14, the cobalt layer 24 does not grow inwardly into the interconnect opening 12 from its sidewalls 14. In addition, the selective deposition also eliminates the need for either polishing or an etch back to remove deposited cobalt from the top surface 16 of the dielectric layer 10. For an interconnect opening 12 that is small or that has a large aspect ratio of depth-to-width, growth on the sidewalls 14, or even the roughness of conventional cobalt metallization formed on the sidewalls 14, may result in pinch-off and void formation before the entrance to the interconnect opening 12 is cleared by cobalt that is exclusively deposited with one or more non-selective deposition processes.

Figure 5:
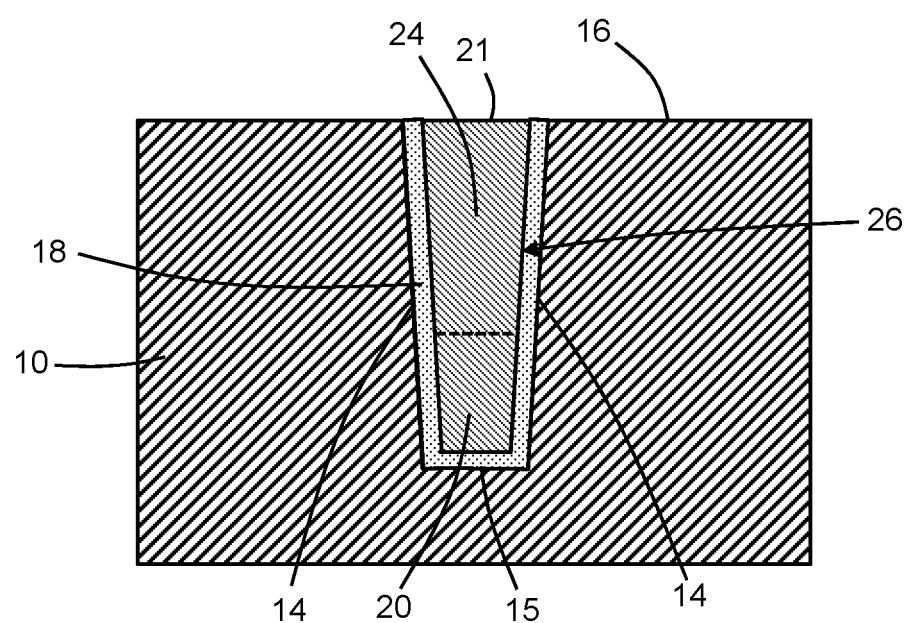

With reference to FIG. 5 in which like reference numerals refer to like features in FIG. 4 and at a subsequent fabrication stage, the barrier/liner layer 18 is removed from the field area on the top surface 16 of dielectric layer 10 by planarization, such as with a chemical mechanical polishing (CMP) process. A small thickness of the top surface 16 of dielectric layer 10 may also be removed during planarization. The cobalt layer 24 inside the interconnect opening 12 is also planarized relative to the top surface 16 of the dielectric layer 10 by the CMP process. Material removal during the CMP process combines abrasion and an etching effect that polishes the targeted material and may be conducted with a commercial tool using polishing pads and slurries selected to polish the targeted material(s).

The cobalt from the cobalt layer 20 and the cobalt from the cobalt layer 24 collectively contribute to an interconnect feature 26 formed inside the interconnect opening 12. The interconnect feature 26 may be seamless in that the conducting interconnect 26 is a solid block of cobalt. The interconnect feature 26 that may be used, for example, as a feature in a middle-of-line (MOL) interconnect structure or as a feature in a back-end-of-line (BEOL) interconnect structure. The interconnect feature 26, which is composed in its entirety of cobalt, is embedded in the dielectric layer 10 after planarization.

The barrier/liner layer 18 operates as a diffusion barrier to block cobalt from being transported outwardly from the interconnect feature 26 into the dielectric layer 10. The selective growth of the cobalt layer 24 may reduce the risk of pinch-off when forming the interconnect feature 26 without the necessity of reducing the thickness of the barrier/liner layer 18. Selective growth of cobalt is insensitive to the profile features, such as overhang, undercut, and aspect ratio, associated with the interconnect opening 12, and may permit the growth of taller interconnect features 26 to lower electrical resistance.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming an interconnect opening in a dielectric layer with one or more sidewalls that penetrate from a top surface of the dielectric layer into the dielectric layer and to a bottom of the interconnect opening;
    depositing a first cobalt layer on the one or more sidewalls of the interconnect opening and at the bottom of the interconnect opening;
    reflowing a first portion of the first cobalt layer with a thermal process from the one or more sidewalls of the interconnect opening to the bottom of the interconnect opening;
    after reflowing the first portion of the first cobalt layer with the thermal process, removing a second portion of the first cobalt layer from the one or more sidewalls of the interconnect opening; and
    after removing the second portion of the first cobalt layer from the one or more sidewalls of the interconnect opening, selectively forming a second cobalt layer on the first cobalt layer that grows from the first cobalt layer at the bottom of the interconnect opening toward the top surface of the dielectric layer.

2. The method of claim 1 wherein the first cobalt layer is removed from the one or more sidewalls of the interconnect opening with a wet chemical etching process.

3. The method of claim 1 wherein the one or more sidewalls of the interconnect opening are lined with a barrier/liner layer that is exposed when the second portion of the first cobalt layer is removed from the one or more sidewalls, and the second cobalt layer does not grow on the barrier/liner layer.

4. The method of claim 1 wherein the first cobalt layer is deposited by chemical vapor deposition.

5. The method of claim 4 wherein the second cobalt layer is selectively formed by electroless deposition.

6. The method of claim 1 wherein the first cobalt layer is reflowed by the thermal process at an elevated temperature during deposition.

7. The method of claim 1 wherein the first cobalt layer is reflowed by the thermal process at an elevated temperature following deposition.

8. The method of claim 1 wherein the first cobalt layer and the second cobalt layer collectively form an interconnect feature in a middle-of-line interconnect structure.

9. The method of claim 1 wherein the first cobalt layer and the second cobalt layer collectively form an interconnect feature in a back-end-of-line interconnect structure.

10. A method comprising:
    forming an interconnect opening in a dielectric layer that penetrates from a top surface of the dielectric layer into the dielectric layer;
    depositing a first cobalt layer by chemical vapor deposition; and
    reflowing a first portion of the first cobalt layer with a thermal process to a bottom of the interconnect opening so that the interconnect opening is partially filled by the first cobalt layer at the bottom of the interconnect opening;
    after reflowing the first portion of the first cobalt layer with the thermal process, removing a second portion of the first cobalt layer from one or more sidewalls of the interconnect opening; and
    after removing the second portion of the first cobalt layer from the one or more sidewalls of the interconnect opening, selectively forming a second cobalt layer on the first cobalt layer that grows from the first cobalt layer at the bottom of the interconnect opening toward the top surface of the dielectric layer.

11. The method of claim 10 wherein the second cobalt layer is selectively formed by electroless deposition.

12. The method of claim 10 wherein the first cobalt layer is reflowed by the thermal process at an elevated temperature during chemical vapor deposition.

13. The method of claim 10 wherein the first cobalt layer is reflowed by the thermal process at a first elevated temperature following chemical vapor deposition.

14. The method of claim 13 wherein the first cobalt layer is reflowed by the thermal process at a second elevated temperature during chemical vapor deposition.

15. The method of claim 10 wherein the first cobalt layer and the second cobalt layer collectively form an interconnect feature in a middle-of-line interconnect structure.

16. The method of claim 10 wherein the first cobalt layer and the second cobalt layer collectively form an interconnect feature in a back-end-of-line interconnect structure.

17. The method of claim 1 wherein the first cobalt layer is deposited with a first thickness on the one or more sidewalls of the interconnect opening, the first cobalt layer has a second thickness greater than the first thickness at the bottom of the interconnect opening after the thermal process, and the second portion of the first cobalt has a third thickness that is less than the first thickness after the thermal process.

18. The method of claim 10 wherein, the first cobalt layer has a first thickness at the bottom of the interconnect opening after the thermal process, and the second portion of the first cobalt layer has a second thickness on the one or more sidewalls of the interconnect opening that is less than the first thickness after the thermal process.

* * * * *